United States Patent [19]

Magome

[11] Patent Number: 5,004,348

[45] Date of Patent: Apr. 2, 1991

[54] ALIGNMENT DEVICE

[75] Inventor: Nobutaka Magome, Kawasaki, Japan

[73] Assignee: Nikon Corporation, Tokyo, Japan

[21] Appl. No.: 536,939

[22] Filed: Jun. 12, 1990

Related U.S. Application Data

[63] Continuation of Ser. No. 469,713, Jan. 24, 1990, abandoned, which is a continuation of Ser. No. 192,784, May 10, 1988, abandoned.

[30] Foreign Application Priority Data

May 15, 1987 [JP] Japan .............................. 62-118500

[51] Int. Cl.$^5$ ............................................. G01B 11/26
[52] U.S. Cl. .................................. 356/401; 250/548; 356/363
[58] Field of Search ............... 356/399, 400, 401, 363; 250/548, 557, 561

[56] References Cited

U.S. PATENT DOCUMENTS

| | | | |
|---|---|---|---|
| 4,251,160 | 2/1981 | Bouwhuis et al. | 356/401 |
| 4,269,505 | 5/1981 | Mayer | 355/62 |
| 4,492,459 | 1/1985 | Omata | 355/43 |
| 4,710,026 | 12/1987 | Magome et al. | 356/349 |

Primary Examiner—F. L. Evans
Attorney, Agent, or Firm—Shapiro and Shapiro

[57] ABSTRACT

An apparatus for aligning a mask and a substrate by detecting diffracted light from a first and second diffraction gratings. The apparatus comprises an illumination light source for irradiating light of a predetermined wavelength, a detection optical system, having an aberration along an optical axis corrected in a predetermined manner, and an orientation control device for controlling the light orientation of the predetermined wavelength.

16 Claims, 3 Drawing Sheets

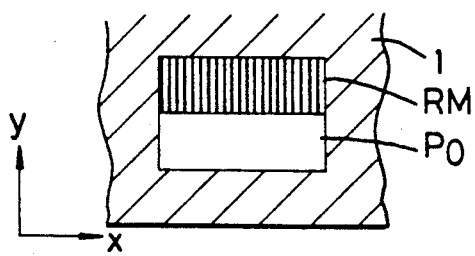
FIG. 3A
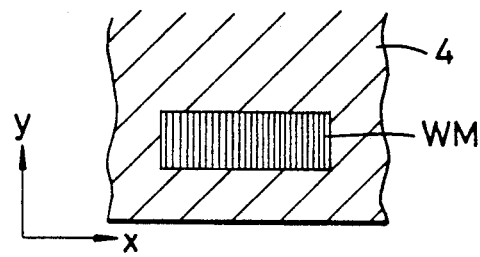
FIG. 3B
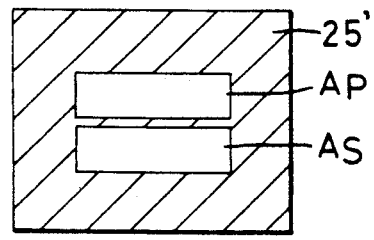
FIG. 3C
FIG. 4
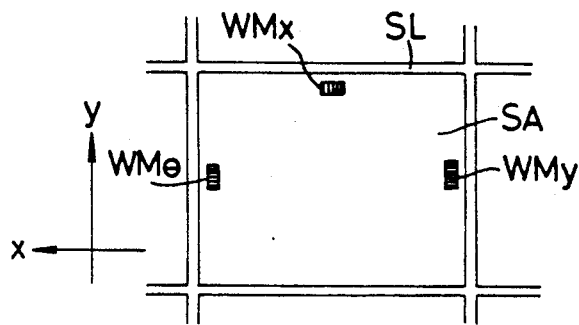
FIG. 5
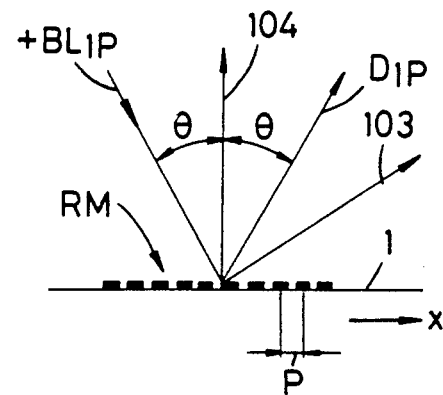

ALIGNMENT DEVICE

This is a continuation of application Ser. No. 469,713 filed Jan. 24, 1990, which is a continuation of application Ser. No. 192,784 filed May 10, 1988, both of which are now abandoned.

BACKGROUND OF THE INVENTION

1. Field of the Invention

The present invention relates to an alignment device of a projection type exposure apparatus used in manufacture of a semiconductor device, and more particularly to a device for aligning a mask bearing an original pattern relative to a substrate such as a semiconductor wafer on which the original pattern is to be transferred.

2. Related Background Art

A projection type exposure apparatus (stepper) has been widely used as an apparatus for transferring a fine pattern such as a semiconductor device pattern onto a semiconductor wafer with a high resolution. In the prior art stepper, in order to align a reticle (or mask) to a shot area on the wafer, an alignment mark formed on a periphery of a circuit pattern of the reticle and an alignment mark formed in a periphery of the shot area on the wafer are simultaneously detected.

In the alignment system, the mark on the reticle and the mark on the wafer are detected with high precision, a relative positional deviation is detected, and the reticle or wafer is finely moved to compensate for the deviation. In the projection type exposure apparatus, in order to focus the pattern of the reticle onto the wafer with high resolution, a projection optical system is usually corrected for chromatic aberration to only an exposure illumination light (for example, g-ray having a wavelength of 436 nm or i-ray having a wavelength of 365 nm). This means that, in an alignment optical system for detecting the mark of the reticle and the mark of the wafer through the projection optical system, the mark illumination light is limited to the wavelength of the exposing light or one which is very close thereto.

The wafer in the exposure step has a resist layer formed thereon. In the alignment step, the mark on the wafer is detected through the resist layer. In order to allow formation of a pattern of higher resolution, the resist layer usually uses a multi-layer resist structure so that it exhibits a high absorption rate and a low transmission rate to the exposure light. In this case, the alignment illumination light is attenuated before it reaches the mark on the wafer, and reflected light (normal reflected light, scattered light or diffracted light) from the mark is also attenuated so that the mark on the wafer is not well detected by the alignment optical system.

It has been suggested to use light having a wavelength which exhibits a high transmission rate to the resist layer as the alignment illumination light In U.S.P. No. 4,492,459, a small lens for correcting chromatic aberration is arranged in an alignment light path between the reticle and the projection optical system so that the mark on the reticle and the mark on the wafer are conjugated to each other even under light having a different wavelength than the exposure light. In this system, if the correcting optical system is movable relative to the projection optical system, the alignment precision is extremely lowered because of an unstable factor in setting the correction optical system. Accordingly, they are fixed to each other. As a result, the mark on the reticle has to be sufficiently spaced from the area of the circuit pattern so that the correction optical system does not block a portion of the focusing light beam of the circuit pattern in the exposure step. Moreover, in a stepper which sequentially aligns the pattern of a reticle to each of a plurality of shot areas on the wafer by a step-and-repeat method, it is desirable that the alignment be attained for each shot area on the wafer.

The alignment precision will be improved if the detection resolution of the mark is improved, and a diffraction grating is known as a mark which permits the detection with highest precision. In this method, a positional error between the reticle and the wafer is detected based on a phase difference between photo-electric signals produced by moving diffracted light generated by a grating formed on the reticle as the mark and a grating formed on the wafer as the mark, along a direction of arrangements of the gratings. This method is disclosed in U.S.P. No. 4,251,160. In another method such as a proximity method, a positional error between the mask and the wafer is detected within a resolution of 1/several to 1/several tens of the pitch of the diffraction grating by optical information (sinusoidal intensity information) produced by interfering diffracted light generated by the grating on the mask with diffracted light generated by the grating on the wafer. In one experiment, the detection resolution of several nm has been reported in the alignment using the diffraction gratings.

The prior art projection type exposure apparatus having the correction optical system involves the following problem.

The shot areas on the wafer are usually partitioned by scribelines having a width of 50–100 $\mu$m. If a mark associated with one shot area is to be formed on the scribe line spaced by 100 $\mu$m from the circuit pattern area, the mark on the reticle is spaced from the circuit pattern area on the reticle by only 1000 $\mu$m (1 mm) if a reduction factor of the projection optical system is 1/10. If the correction optical system is constructed by a small lens, a lens system having a diameter of only 2 mm (including a lens barrel) must be provided in order to prevent the focusing light path of the circuit pattern from being blocked. This is very impractical. In order to solve the above problem, U.S.P. No. 4,269,505 discloses a correction optical system which maintains a conjugate relationship between the mark on the reticle and the mark associated with the shot area on the wafer even if the mark on the reticle is largely spaced from the circuit pattern area.

However, the apparatus disclosed in U.S.P. No. 4,492,459 and 4,269,505 can not comply with change of the shot area on the wafer (the size of the circuit pattern on the reticle), and hence a construction to move the correction optical system (or a portion thereof) must be adopted, or a site alignment system in which relative positions of the reticle and the wafer are offset by a predetermined distance between the alignment step and the exposure step must be adopted.

The alignment system which uses diffraction gratings allows mark position detection with high resolution. However, in the technique disclosed in U.S.P. No. 4,251,160, the same problem as that raised by the provision of the correction optical system arises because an optical modulator is provided in the alignment light path between the reticle and the projection optical system. Although an alignment system which directly utilizes the periodic optical information uniquely defined by a periodic structure of the diffraction grating allows high precision detection, it is not a practical structure applicable to a projection type exposure apparatus, particularly a stepper.

SUMMARY OF THE INVENTION

The present invention solves various problems encountered in applying an alignment system using diffraction gratings to a projection type exposure apparatus, and provides stability of the apparatus and improvement of the alignment precision.

In the present invention, an alignment illumination light having a different wavelength than that of a transfer illumination light is used. The alignment illumination light preferably has a wavelength which is insensitive to a resist layer, that is, a wavelength which exhibits a high transmission rate to the resist layer.

The alignment illumination light is irradiated to a diffraction grating formed on a mask (reticle) and a diffraction grating formed on a substrate (wafer) through an imaging optical system (projection lens). Provided between a light source of the alignment illumination light and the mask is a detection optical system having an aberration along an optical axis corrected in accordance with a chromatic aberration of the imaging optical system created to the wavelength of the alignment illumination light. The detection optical system is typically a two-focus optical system, in which one focal point of the two-focus optical system is on a plane on which the diffraction grating of the mask is formed, and the other focal point is on (conjugate with) a plane on which the diffraction grating of the substrate is formed through the imaging optical system. Orientation control means is provided to control the orientation of the alignment illumination light so that the diffraction gratings are illuminated in different directions from each other when the alignment illumination light is directed to the mask through the two-focus optical system.

In accordance with the present invention, the detection optical system, such as a two-focus optical system, is provided in the illumination light transmission light path of the alignment optical system to render the illumination light to be bi-focal (decoloring) in accordance with the chromatic aberration so that the correction optical system is not required between the mask (reticle) and the projection optical system. As a result, in spite of the detection of the mark (diffraction grating) by the light having a different wavelength than that of the exposure light, the problems encountered in the prior art apparatus due to the correction optical system are cleared and very stable alignment is attained. In order to detect relative positional error between the grating on the mask and the grating on the substrate, the orientation characteristic of the alignment illumination light applied to the two-focus optical system (detection optical system) is controlled such that the alignment illumination light is irradiated in two different directions with respect to the direction of orientation of the grating. As a result, normal reflected light and diffracted light ($\pm 1$-order light, $\pm 2$-order light and etc.) are clearly separated, and the positional error between the gratings is detected with a high precision by using the diffracted light. By applying the illumination light to the diffraction grating in two directions, the diffracted light generated by the irradiation in one direction and the diffracted light generated by the irradiation in the other direction may be caused to interfere in one light path. Accordingly, a so-called optical heterodyne method can be easily adopted and the resolution of the measurement of the positional error is very high, and the reproducibility and stability of the measurement are highly improved.

BRIEF DESCRIPTION OF THE DRAWINGS

FIG. 3A is a plan view showing a shape of a diffraction grating mark on a reticle, FIG. 3B is a plan view showing a shape of a diffraction grating mark on a wafer, FIG. 3C is a plan view showing a shape of a mask member provided in a photo-electric detection system, FIG. 4 is a plan view showing an arrangement of marks on the wafer, and FIG. 5 illustrates an incident laser beam.

DETAILED DESCRIPTION OF THE PREFERRED EMBODIMENTS

Figure 1:
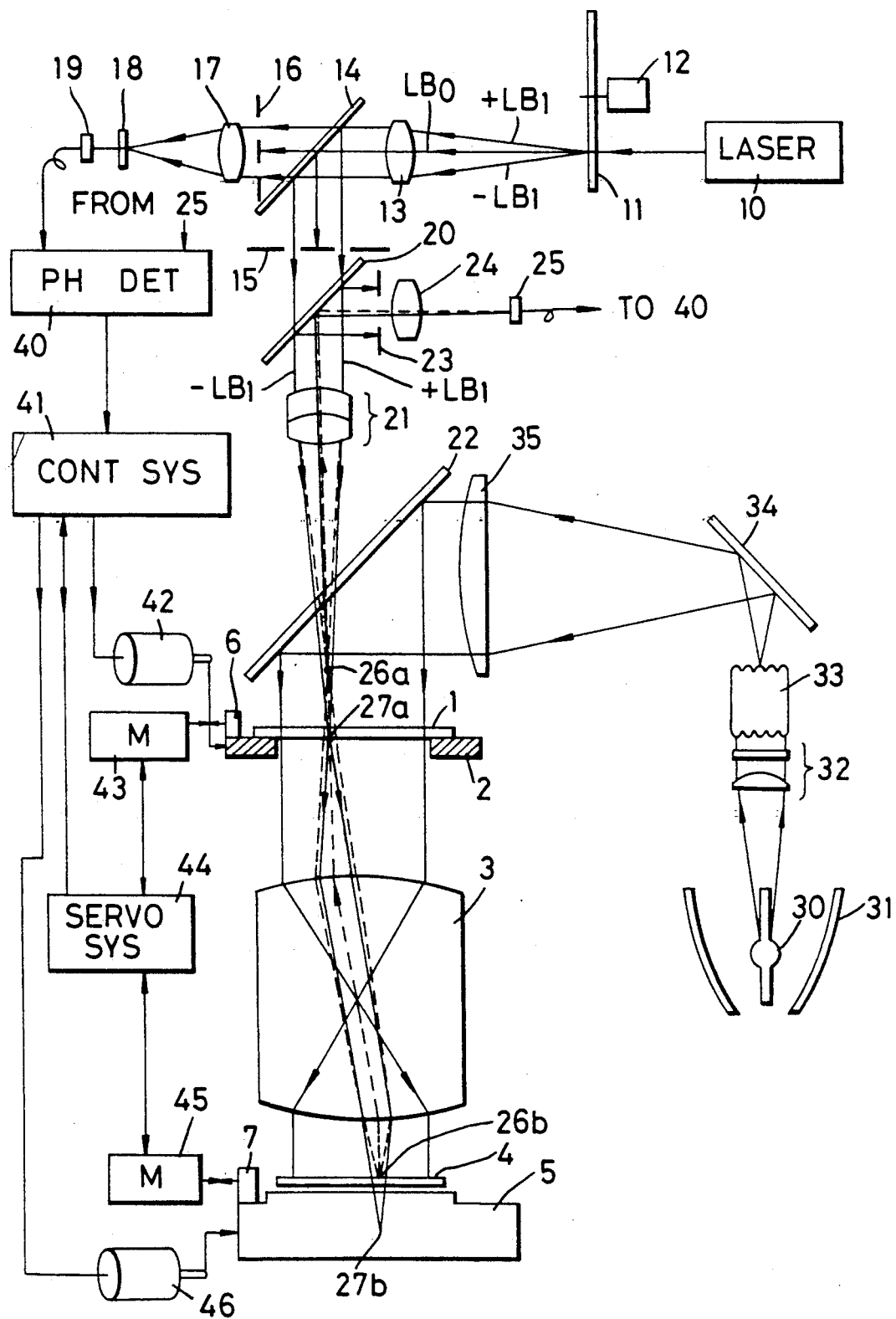
FIG. 1 shows an overall configuration of one embodiment of a projection type exposure apparatus of the present invention.

One embodiment of the alignment device of the present invention is explained with reference to FIG. 1. A reticle 1 bearing a predetermined circuit pattern and an alignment diffraction grating thereon is held by a two-dimensionally movable reticle stage 2. The patterns on the reticle 1 are imaged on a wafer 4 under an exposure light by a double telecentric projection lens 3. The projection lens 3 is corrected for a chromatic aberration with respect to a wavelength (g-ray, i-ray, etc.) of an exposure illumination light, and the reticle 1 and the wafer 4 are arranged to be conjugated with each other with respect to the wavelength of the exposure illumination light. A similar diffraction grating mark to the grating mark formed on the reticle 1 is formed on the wafer 4. The wafer 4 is sucked to a stage 5 which is two-dimensionally moved in a step-and-repeat method, and when the transfer and exposure of the reticle 1 to one shot area on the wafer 4 is completed, the wafer 4 is stepped to the next shot position. Fixed to a portion of the reticle stage 2 is a movable mirror 6 which reflects a laser beam emitted from a laser beam interference range finder (interferometer) 43 for detecting x-axis, y-axis and rotation ($\theta$) positions of the reticle 1 in a horizontal plane. The interferometer 43 has three range finder laser beams to allow independent detection of x-axis, y-axis and $\theta$-axis positions. For simplification purpose, only a portion thereof is shown in FIG. 1. A movement stroke of the reticle stage 2 is less than several mm and a detection resolution of the interferometer is 0.01 $\mu$m, for example. Fixed to a portion of the wafer stage 5 is a movable mirror 7 which reflects a laser beam emitted from an interferometer 45 for detecting x-axis and y-axis positions of the wafer 4 in a horizontal plane. The interferometer 45 also has two range finder laser beams to allow independent detection of the x-axis and y-axis positions, although only a portion thereof is shown for simplification purpose. The x-axis, y-axis and $\theta$-axis drives of the reticle stage 2 are effected by a drive motor 42, and the two-dimensional movement of the wafer stage 5 is effected by a drive motor 46.

The exposure illumination system comprises a mercury lamp 30, an elliptical mirror 31, input lenses 32 including a condenser lens and an interference filter, an optical integrator (flyeye lens) 33, a mirror 34, a main condenser lens 35 and a dichroic mirror 22. The dichroic mirror 22 is arranged at 45° above the reticle 1 and reflects the exposure light from the condenser lens 35 perpendicularly downward to uniformly illuminate the reticle 1. The dichroic mirror 22 has a reflection factor of more than 90% to the wavelength of the exposure light and a transmission of more than 50% to a wavelength of the alignment illumination light (which is longer than the wavelength of the exposure light).

The alignment system in the present embodiment will now be explained. The alignment illumination light is emitted from a laser light source 10, passes through a radial grating 11 which is a radial transmissive reference diffraction grating and reaches a spatial filter 15 arranged on a Fourier plane (pupil plane of the alignment optical system) through a Fourier transform lens 13 and a beam splitter 14. The radial grating 11 is disclosed in U.S.P. No. 4,710,026 and it is rotated by a motor 12 at a substantially constant speed. The laser beam applied to the radial grating 11 is diffracted to produce 0-order light, ±1-order lights, ±2-order lights, etc. which are spread at different diffraction angles. In FIG. 1, only the 0-order light $LB_0$, +1-order light $+LB_1$ and $-1$-order light $-LB_1$ are shown. Those 0-order and ±1-order lights distribute clearly separately on the spatial filter 15, and only the 0-order light $LB_0$ is blocked and the ±1-order lights are transmitted.

The ±1-order lights transmitted through the spatial filter 15 pass through the beam splitter 20 and are directed to a two-focus optical system 21. The two-focus optical system 21 which is briefly shown in FIG. 1 comprises a combination of a double refraction material (quartz, calcite etc.) and a telecentric objective lens for a microscope, and produces different powers in accordance with polarization components (P polarization and S polarization) of the ±1-order lights of the laser beam. One polarization light (e.g. S polarization) emitted from the two-focus optical system 21 is focused at a focal point 26a above the reticle 1, and the other polarization light (e.g. P polarization) is focused at a focal point 27a on a pattern plane on the bottom surface of the reticle 1. The other focal point of the two-focus optical system 21, that is, a plane facing the laser light source 10 which is conjugated with the focal points 26a and 27a is on the radial grating 11. The spacing along the optical axis between the two focal points 26a and 27a of the two-focus optical system 21 corresponds to the chromatic aberration of the projection lens 3 on the side facing the reticle 1 at the wavelength of the alignment laser beam. The focal plane 26a is conjugated with the focus plane 26b which is on the surface of the wafer 4, by the projection lens 3, and the focal plane 27a (reticle pattern plane) is conjugated with the focus plane 27b below the surface of the wafer 4, by the projection lens 3. The spacing between the focus planes 26b and 27b corresponds to the chromatic aberration of the projection lens 3 on the side facing the wafer 4.

Usually, $$Dr = M^2 \cdot Dw$$

where Dw is the spacing between the focus planes 26b and 27b, Dr is the spacing between the focal planes 26a and 27a, and 1/M is a projection magnification of the projection lens 3 (Usually, M is 1, 2.5, 5 or 10). The farther the wavelength of the alignment laser beam is away from the wavelength of the exposure light, the larger are Dw and Dr in accordance with the aberration characteristic of the projection lens 3. A depth of focus of the projection lens of this type is very short, usually ±1 μm, and the spacing Dw may reach several tens μm depending on the wavelength of the alignment illumination light.

It is preferable that the alignment illumination light (laser beam) has a wavelength which is substantially insensitive to a resist layer applied to the wafer 4, but it is not necessary in the present invention because a very large aberration is produced by the projection lens at the wavelength of the exposure light and the wavelength of the alignment illumination light and a big distortion is applied to the light information from the diffraction grating mark on the wafer 4. Accordingly, it is more important to put a priority in selecting an optimum alignment illumination light by taking the aberration into account. Thus, a wavelength which is slightly sensitive may be used. In this case, if the alignment illumination light irradiates the resist layer for a long time (e.g. 1 minute or longer), it may be sensitized (and reduced in thickness when it is developed).

The ±1-order lights $LB_1$ (P polarization) of the alignment laser beam are focused on the focal plane 27a at the diffraction grating mark area of the reticle 1 at an angle made between the +1-order light $+LB_1$ and the −1-order lights $-LB_1$. The ±1-order lights $LB_1$ (S polarization) from the focal plane 26a, transmitted through a transparent area of the reticle 1 are focused through the projection lens 3 on the focal plane 26b at the diffraction grating mark area of the wafer 4 at an angle made between the +1-order light and the −1-order light.

The reflected and diffracted light from the diffraction grating mark of the reticle 1 passes through the dichroic mirror 22 and the two-focus optical system 21, is reflected by the beam splitter 20, filtered by the spatial filter 23, condensed by a condenser lens 24 and directed to a photo-electric detector 25.

The reflected and diffracted light from the diffraction grating mark of the wafer 4 passes through the projection lens 3, returns to the original light path, passes through the transparent area of the reticle 1, the dichroic mirror 22, the two-focus optical system 21, the beam splitter 20, the spatial filter 23 and the condenser lens 24, and is directed to a photo-electric detector 25.

The spatial filter 23 is arranged at a position which is conjugated with a pupil plane of the alignment optical system, that is, a position which is substantially conjugated with a pupil (exit pupil) of the projection lens 3, and it blocks normal reflected light from the reticle 1 or the wafer 4 and transmits only the light diffracted normally to the diffraction grating on the reticle 1 or the wafer 4. The photo-electric detector 25 is arranged to be conjugated with the reticle 1 and the wafer 4 through the two-focus optical system 21 and the lens 24.

The photo-electric signal from the photo-electric detector 25 is a sinusoidal A.C. signal representing a rotational speed of the radial grating 11 because the diffracted light from the two diffraction grating marks interfere each other. The ±1-order lights and 0-order light from the radial grating 11 pass through the beam splitter 14, and only the 0-order light is blocked by the spatial filter 16 arranged at the pupil (Fourier plane) and the transmitted lights are focused on a reference diffraction grating 18 by a lens system (reverse Fourier transform lens) 17. The reference diffraction grating 18 is fixed on the device. The +1-order light $+LB_1$ and the −1-order light $-LB_1$ are applied to the diffraction grating 18 in the directions at a predetermined angle therebetween.

The photo-electric detector 19 detects the diffracted light (or interference light) transmitted through the reference diffraction grating 18 and produces a sinusoidal photo-electric signal. A phase detector 40 receives the photo-electric signal from the photo-electric detector 25 and the photo-electric signal from the photo-electric detector 19 to detect a phase difference between the waveforms of those signals. The detected phase difference (±180°) corresponds to the relative positional error which is within one half of a grating pitch of the diffraction grating marks formed on the reticle 1 and the wafer 4. A control system 41 controls the drive motors 42 and 46 in accordance with the information on the phase difference (positional error) and the position information from the interferometers 43 and 45 supplied through a servo system 44 to align the reticle 1 relative to the wafer 4.

In the present embodiment, a portion of the alignment optical system, specifically the two-focus optical system 21 is movable to any point depending on the position of the alignment mark on the reticle 1 so that the mark can be detected wherever the mark is. Since the exposure light and the alignment illumination light are separated by the dichroic mirror 22 obliquely arranged above the reticle 1, the mark can be detected even during the exposure. This means that of the alignment of the reticle 1 and the wafer 4 is disturbed for any reason during the exposure, it can be immediately detected. This also means that the servo positioning of the reticle stage 2 and the wafer stage 5 can be performed in a closed loop even during the exposure, based on the phase difference information from the phase detector 40. The exposure light source may be an excimer laser light source instead of the mercury lamp.

Figure 2:
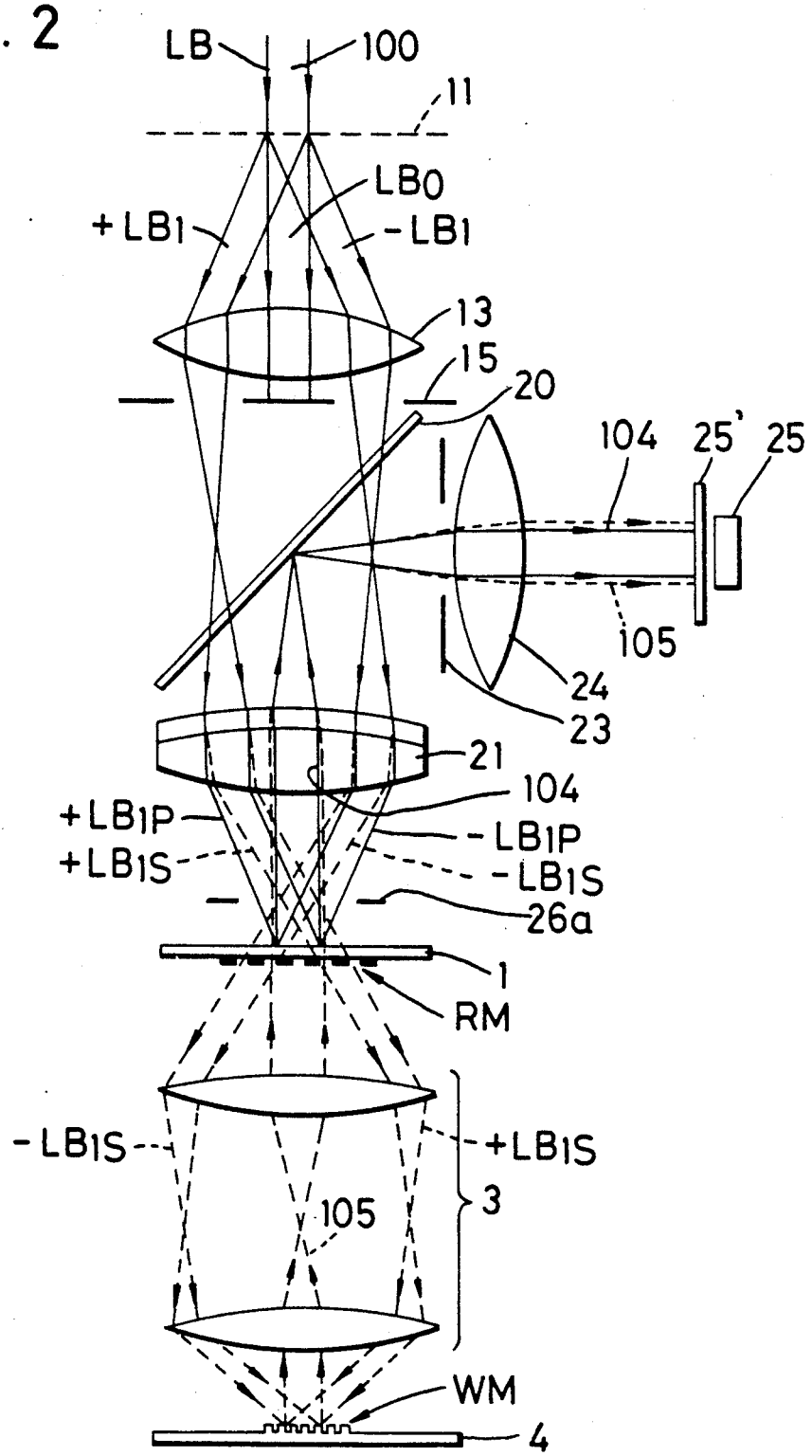
FIG. 2 shows a configuration of an alignment system.

Referring to FIG. 2, a configuration of the alignment system and a principle of alignment are explained. In FIG. 2, like elements to those shown in FIG. 1 are designated by like numerals The laser beam (essentially collimated light beam) LB from the laser light source 10 is applied to the radial grating (reference diffraction grating) 11. The polarization of the laser beam LB is separated to the P polarization and the S polarization by the two-focus optical system 21 and they are focused at focal points 26a and 27a at a predetermined intensity ratio of the P polarization and the S polarization. Usually, the light reaching the wafer 4 has a larger loss and hence the light intensity to the wafer 4 is set higher. To this end, the two-focus element may be rotated around the optical axis, or a λ/2 plate may be inserted between the laser light source and the radial grating 11 and it may be rotated around the optical axis. In this manner, the intensity ratio of the polarized light reaching the reticle 1 and the polarized light reaching the wafer 4 is appropriately adjusted.

The ±1-order lights $LB_1$ from the radial grating 11 are applied to the telecentric two-focus optical system 21, and the +1-order light $+LB_1$ is separated to a P polarized light $+LB_{1P}$ and an S polarized light $+LB_{1S}$ and they reach the reticle 1 with inclination angles to the optical axis of the two-focus optical system 21, determined by the diffraction angles. Similarly, the −1-order light $-LB_1$ is also separated to a P polarized light $-LB_{1P}$ and an S polarized light $-LB_{1S}$ and they reach the reticle 1 at angles symmetric to the +1-order lights ($+LB_{1P}$) and $+LB_{1S}$) with respect to the optical axis. Since the P polarized light is focused at the focal point 27a, that is, the position of the diffraction grating mark RM of the reticle 1, the P polarized 1-order lights $+LB_{1P}$ and $-LB_{1P}$ cross (focus) at the diffraction grating mark RM. In FIG. 2, the grating orientation of the mark RM is along the lateral direction on the plane of drawing, and the inclinations of the 1-order lights $+LB_{1P}$ and $-LB_{1P}$ are also defined in the plane of FIG. 2.

As shown in FIG. 3A, the reticle 1 has the diffraction grating mark RM and a transparent window Po. The 1-order lights $+LB_{1P}$ and $-LB_{1P}$ irradiate the reticle 1 with a size to cover the mark RM and the window Po. The mark RM is used for x-axis (grating orientation direction) position detection, and a diffraction grating mark WM on the wafer 4 corresponds thereto, as shown in FIG. 3B. The mark WM is arranged to align to the window Po of the reticle 1 when they align (or during exposure).

The S polarized 1-order lights $+LB_{1S}$ and $-LB_{1S}$ emitted from the two-focus optical system 21 are focused at the focal point 26a, pass through the window Po of the reticle 1 and are directed to the diffraction grating mark WM on the wafer 4 through the projection lens 3 in two different directions. The S polarized 1-order lights $+LB_{1S}$ and $-LB_{1S}$ emitted from the projection lens 3 are directed symmetrically with respect to the grating orientation direction of the diffraction grating mark WM. The angle made by the S polarized 1-order lights $+LB_{1S}$ and $-LB_{1S}$ reaching the wafer 4 does not exceed the number of aperture of the projection lens 3 on the side facing the exit (wafer). Since the reticle 1 and the wafer 4 are arranged to be conjugated to the radial grating 11, the diffracted light beams $+LB_{1P}$, $-LB_{1P}$, $+LB_{1S}$ and $-LB_{1S}$ are collimated if the laser beam LB is collimated.

The behavior of the P polarized 1-order lights $+LB_{1P}$ and $-LB_{1P}$ to the mark RM of the reticle 1 is explained with reference to FIG. 5.

FIG. 5 diagrammatically shows the mark RM of the reticle 1. It is assumed that the P polarized 1-order light $+LB_{1P}$ is directed to the mark RM at an angle θ. The normal reflected light $D_{1P}$ of the 1-order light $+LB_{1P}$ from the reticle 1 is reflected at the angle θ. The incident angle θ of the light $+LB_{1P}$ means that the light $-LB_{1P}$ is also directed to the reticle at the angle θ in the opposite direction to the normal reflected light $D_{1P}$. A grating pitch P of the diffraction grating mark RM and the angle 8 are determined to meet the following reaction:

$$\sin \theta = \frac{\lambda}{P} \times n \quad (1)$$

where λ is a wavelength of the laser beam LB and n is an integer. When the relation (1) is met, the diffracted light 104 of a specified order generated by the mark RM by the irradiation of the 1-order lights $+LB_{1P}$ and $-LB_{1P}$ travels normally to the reticle 1, that is, along the optical axis of the two-focus optical system 21. Other diffracted light 103 is also generated but it travels in a different direction than that of the diffracted light 104.

The lights $+LB_{1P}$ and $-LB_{1P}$ are directed to the mark RM of the reticle 1 in two crossing directions. Since both beams are emitted from one laser light source 10, a bright-dark fringe or interference fringe is formed on the mark RM by the interference of the two light beams $+LB_{1P}$ and $-LB_{1P}$. Assuming that the radial grating 11 is stationary, the interference fringe extends in the grating orientation direction of the mark RM at a predetermined pitch. The pitch of the interference fringe and the grating pitch of the mark RM are appropriately determined depending on the required detection resolution. Accordingly, the diffracted light 104 from the mark RM is created by the irradiation of the interference fringe to the mark RM. Otherwise, the diffracted light generated from the mark RM by the irradiation of the light beam $+LB_{1P}$ and the diffracted light generated from the mark RM by the irradiation of the other light beam $-LB_{1P}$ are returned to the common light path (on the axis of the two-focus optical system 21) and interfere with each other. By the irradiation of the light beams $+LB_{1P}$ and $-LB_{1P}$ onto the mark RM from the two different directions, the interference fringe is formed on the mark RM. If the radial grating 11 rotates, the interference fringe moves in the grating orientation direction of the mark RM, because dark view field images of the radial grating 11 by the 1-order lights $+LB_1$ and $-LB_1$ are focused on the mark RM of the reticle 1. Accordingly, by scanning the mark RM by the interference fringe (diffracted image of the radial grating 11 projected by the two-focus optical system 21), the diffracted light 104 periodically repeats bright and dark areas. As a result, the signal from the photo-electric detector 25 is a sinusoidal AC signal corresponding to the period of change of bright and dark areas.

The above is equally applicable to the relation between the diffraction grating mark WM on the wafer 4 and the S polarized light beams $+LB_{1S}$ and $-LB_{1S}$. The diffracted light 105 is generated from the mark WM and it travels along a main optical axis of the projection lens 3 and reaches the photo-electric detector 25 through the window Po of the reticle 1. The S polarized light beams $+LB_{1S}$ and $-LB_{1S}$ emitted from the two-focus optical system 21 are focused at the focal point 26a to cross each other but they are largely defocused at the mark RM of the reticle 1 and the window Po.

In the present embodiment, the photo-electric detector 25 is arranged to be conjugated with the mark RM and the mark WM through the two-focus optical system 21. Actually, as shown in FIG. 2, a mask member 25' shown in FIG. 3C is provided at a position conjugate with the marks RM and WM, and the diffracted lights 104 and 105 passed through apertures Ap and As of the mask member 25' are photo-electrically detected. The aperture Ap functions to extract the diffracted image from the mark RM by the diffracted light 104, and the aperture As functions to extract the diffracted image from the mark WM of the wafer 1 by the diffracted light 105. Accordingly, the position detection of the reticle 1 by the mark RM and the position detection of the wafer 1 by the mark WM are independently effected by separately providing photo-electric detectors 25 behind the apertures Ap and As. The image of the mark RM of the reticle 1 irradiated by the P polarized light beams $+LB_{1P}$ and $-LB_{1P}$ is formed in the aperture Ap, and the reflected and diffracted lights of the S polarized light beams $+LB_{1S}$ and $-LB_{1S}$ are also applied as a background noise. Thus, a polarization plate which transmits the P polarized light is provided at the aperture Ap, and a polarization plate which transmits the S polarized light is provided at the aperture As. In this manner, the crosstalk of the light from the wafer and the light from the reticle in the two photo-electric detectors 25 is sufficiently reduced.

The photo-electric signal of the diffracted light 04 produced through the aperture Ap when the radial grating 11 is stationary is analyzed below. In the formula (1), n is set to $\pm 1$. The grating pitch P is in a focusing magnification relation with the pitch of the reference grating of the radial grating 11 through the lens 13 and the two-focus optical system 21. (Similarly, the grating pitch of the mark WM on the wafer 4 is in a focusing magnification relation of the projection lens 3 with the grating pitch P of the mark RM.) The amplitude $VR^+$ of the diffracted light generated by the light beam $+LB_{1P}$ directed to the mark RM is given by a formula (2) and the amplitude $VR^-$ of the diffracted light generated by the light beam $-LB_{1P}$ is given by a formula (3).

$$VR^+ = a \cdot \sin\left(\phi + 2\pi \frac{x}{P}\right) \quad (2)$$

$$VR^- = a' \cdot \sin\left(\phi - 2\pi \frac{x}{P}\right) \quad (3)$$

where P is the grating pitch of the mark RM and x is a displacement of the mark RM in the direction of grating orientation. Since the interference light of the two diffracted lights $VR^+$ and $VR^-$ is photo-electrically detected, the change in the photo-electric signal (amplitude of the diffracted light 104) is represented by:

$$|VR^+ + VR^-|^2 = a^2 + a'^2 + 2 \cdot a \cdot a' \cos\left(4\pi \frac{x}{P}\right) \quad (4)$$

where $a^2 + a'^2$ is a bias (D.C. component) of the signal and $2a \cdot a'$ is an amplitude component of the signal change. As seen from the formula (4), the photo-electric signal sinusoidally changes as the radial grating 11 and the mark RM are relatively displaced in the direction of the grating orientation. Each time the relative displacement x reaches $x = P/2$ (one half of the grating pitch), the signal amplitude changes by one period. The same is applicable to the diffracted light 105 from the mark WM of the wafer 4 and it is represented by the formula (4). The alignment is completed by moving the reticle 1 or wafer 4 such that the phases of the two photo-electric signals are matched. As seen from the formula (4), the signal is sinusoidal and the phase difference that can be detected in within $\pm 180$ degrees. Accordingly, it is necessary that the reticle 1 and the wafer 4 are prealigned at a precision of less than one half of the grating pitch P of the marks RM and WM. When the radial grating 11 is stationary, the amplitude level of the resulting photo-electric signal changes sinusoidally by moving the reticle 1 or the wafer 4.

When the radial grating 11 is rotating, the diffracted lights 104 and 105 are periodic (sinusoidal) bright-and-dark information, and the resulting photo-electric signal is a sinusoidal AC signal even if the reticle 1 or the wafer 4 is stationary. In this case, a phase difference Dr between the photo-electric signal (sinusoidal AC signal) of the diffracted light 104 from the mark RM and the reference photo-electric signal (sinusoidal AC signal) from the photo-electric detector 19 shown in FIG. 1 is detected by the phase detection system. Similarly, a phase difference $\phi w$ between the photo-electric signal of the diffracted light 105 from the mark WM and the reference signal is detected. From a difference between the phase differences $\phi r$ and $\phi w$, the x-axis error between the reticle 1 and the wafer W is determined. This detection system is called an optical heterodyne system. When the reticle 1 and the wafer 4 are within the positional error of one half of the grating pitch P, the positional error can be detected at a high resolution even in the stationary state. Accordingly, this system is conveniently used in the closed loop positioning servo in order to prevent a fine positional error from occurring while the pattern of the reticle 1 is exposed to the resist of the wafer 4. In this detection system, the reticle 1 or the wafer 4 is moved to render $\phi r - \phi w$ to zero (or a predetermined value) to complete the alignment and then the servo may be locked at that alignment position to prevent the reticle 1 and the wafer 4 from being relatively moved.

In the present embodiment, only one set of an alignment optical system is provided to detect the x-axis positional error, although two or three sets are actually required to effect the x-axis and y-axis alignment or the x-axis, y-axis and $\theta$-axis alignment. When three sets of alignment optical system are provided, the arrangement of the marks on the wafer may be one shown in FIG. 4. FIG. 4 shows three diffraction grating marks WMx, WMy and WM$\theta$ associated with one shot area SA on the wafer. The marks WM$\theta$ and WMy are provided at the opposite ends of the shot area and are used for the y-axis detection. From a difference between deviations of the marks WMy and WM$\theta$, a relative rotation error to the reticle 1 is determined for each shot. In FIG. 4, the marks WMx, WMy and WM$\theta$ are provided in the shot area, although they may be provided on the scribe line (street line) SL.

In the present embodiment, the exposure light and the alignment illumination light are separated by the dichroic mirror 22, and the alignment optical system uses illumination light which is hardly sensitive to the resist during the exposure to allow the observation of both the reticle and the wafer. Since the two-focus optical system is used to double-focus the alignment illumination light to comply with the chromatic aberration of the projection lens, the correction optical system required in the prior art device is not necessary in the alignment light path between the reticle and the wafer, and the mark on the reticle and the mark on the wafer can be directly detected to attain high precision alignment. The alignment mark is a diffraction grating which allows the detection of positional error at a high resolution, and the change in the level of the sine wave of the diffracted light generated in accordance with the periodic structure of the diffraction grating is monitored. In addition, the illumination light having the wavelength which is transparent to the resist (non-sensitive light) is used. Accordingly, very stable and high precision positional error detection is attained. In the present embodiment, the radial grating is rotated to impart linearly changing phases, in time, to the two light beams $+LB_{1S}$ and $-LB_{1S}$) which illuminate the diffracted or $+LB_{1S}$ and $-LB_{1S}$) which illuminate the diffracted grating mark in two directions in order to detect the positional error in the optical heterodyne system. Alternatively, the optical heterodyne system measurement may be attained by using a Sehmann laser as the laser light beam LB and directing it to a fixed reference diffraction grating to produce two light beams, or using an ultrasonic optical modulator (AOM) to produce two laser beams having a slight frequency difference therebetween. When the ultrasonic optical modulator is used, no mechanical moving element such as radial grating is necessary and the frequency difference caused by the modulation is much larger than that by the radial grating. Accordingly, the resolution of the phase difference detection is further enhanced In the present embodiment, the exposure light and the alignment light have different wavelengths and the chromatic aberration is large. Accordingly, the detection optical system uses the two-focus element. However, if the projection lens per se is corrected for the aberration for the two wavelengths, the two-focus element is not necessary and a telecentric objective lens which is decolored at the two wavelengths may be used instead. Even in this case, the signal from the wafer and the signal from the reticle may be separately received on the detection plane of the detection system because the wafer, reticle and detection plane are conjugate under the wavelength of the alignment light.

The wavelength of the exposure light may be close to the wavelength of the alignment light. In this case, a large chromatic aberration is not created by the projection lens but an aberration may reside to an extent that it affects the alignment precision because of essentially different light sources. Thus, the detection optical system uses a decolored telecentric objective lens. If there is no light source available which generates the alignment light close to the wavelength of the exposure light, a laser beam may be directed to a non-linear crystal to generate a harmonic wave therefrom. In the exposure apparatus which uses an excimer laser, there may be no laser available which continuously oscillates at a wavelength close to the wavelength of the exposure light In this case, the non-linear crystal may be used to extract a desired alignment light.

I claim:

1. An alignment device for relatively aligning a mask and a substrate by arranging said mask and said substrate in substantially conjugate relation with respect to light of a first wavelength through an imaging optical system and detecting diffracted lights from a first alignment diffraction grating formed on said mask and a second alignment diffraction grating formed on said substrate, comprising:

an illumination light source for irradiating light of a second wavelength essentially different from said first wavelength to said first diffraction grating and said second diffraction grating;

a detection optical system provided between said illumination light source and said mask;

said detection optical system having an aberration along an optical axis corrected in accordance with a chromatic aberration of said imaging optical system caused by the light of said second wavelength; and an orientation control means for controlling the orientation of the light of said second wavelength such that said first diffraction grating and said second diffraction grating are illuminated from different directions when the light of said second wavelength is directed through said detection optical system.

2. An alignment device according to claim 1 wherein said orientation control means includes a reference diffraction grating arranged in substantially conjugate relation to said first diffraction grating and said second diffraction grating through said detection optical system, the light of said second wavelength from said illumination light source is directed to said reference diffraction grating, and resulting positive and negative order lights other than a 0-order light are directed to said detection optical system.

3. An alignment device for relatively aligning a mask and a substrate by arranging said mask and said substrate in substantially conjugate relation with respect to light of a first wavelength through an imaging optical system and detecting diffracted lights from a first alignment diffraction grating formed on said mask and a second alignment diffraction grating formed on said substrate, comprising:
- an illumination light source for irradiating light of a second wavelength essentially different form said first wavelength to said first diffraction grating and said second diffraction grating;
- a detection optical system provided between said illumination light source and said mask;
- said detection optical system having a first focal surface substantially coincident with said mask and a second focal surface away from said first focal surface by a distance corresponding to an aberration along an optical axis of said imaging optical system caused by the light of said second wavelength; and
- an orientation control means for controlling the orientation of the light of said second wavelength such that plural parts of the light of said second wavelength cross each other on said first diffraction grating an on said second diffraction grating when the light of said second wavelength is directed through said detection optical system.

4. An alignment device for aligning a first object and a second object, comprising:
- an imaging optical system provided between said first and second objects;
- said imaging optical system making said first and second objects conjugate with respect to light of a first wavelength;
- a first diffraction grating provided on said first object;
- a second diffraction grating provided on said second object;
- a light source for supplying a luminous flux of a second wavelength essentially different form said first wavelength;
- a detection optical system provided between said light source and said first object;
- said detection optical system having a first focal surface substantially coincident with said first object and a second focal surface away from said first focal surface by a distance corresponding to an aberration along an optical axis of said imaging optical system caused by said luminous flux of said second wavelength;
- an orientation means for determining a direction of the luminous flux of said second wavelength such that plural parts of the luminous flux of said second wavelength are irradiated on said first diffraction grating from different directions from each other and other plural parts of the luminous flux of said second wavelength are irradiated on said second diffraction grating from different directions from each other; and
- means for determining relative alignment relation between said first and second objects by receiving interference light by said first diffraction grating and directed in a special direction and interference light diffracted by said second diffraction grating and passing through said imaging optical system.

5. An alignment device according to claim 4, wherein said orientation means irradiates said luminous flux on said first and second diffraction gratings from mutually different directions with respect to the orientation of each of said diffraction gratings.

6. An alignment device according to claim 4, wherein said detection optical system includes a two-focus optical system, said two-focus optical system having a first focus coincident with said first object and a second focus conjugate with said second object through said imaging optical system.

7. An alignment device according to claim 4, further including a photoelectric detection means for producing a frequency signal on the basis of light diffracted by said first diffraction grating and light diffracted by said second diffraction grating.

8. An alignment device according to claim 7, further including means provided between said light source and said detection optical system for producing a reference signal having a reference frequency on the basis of the luminous flux of said second wavelength, and means for comparing said frequency signal from said photoelectric detection means to said reference signal.

9. An alignment device according to claim 8, wherein said means for making said reference signal includes a reference diffraction grating and means for irradiating the luminous flux of said second wavelength on said reference diffraction grating from mutually different directions.

10. An alignment device for an object, comprising:
- a diffraction grating provided on said object;
- a reference diffraction grating fixedly provided;
- a light source for supplying luminous flux;
- a first objective lens provided between said light source and said object;
- a second objective lens provided between said light source and said reference diffraction grating;
- an orientation means for determining a direction of luminous flux from said light source and directing the flux to said first and second objective lenses such that said luminous flux is irradiated on the diffraction grating on said object through said first objective lens from mutually different directions and said luminous flux is irradiated on said reference diffraction grating through said second objective lens from mutually different directions; and
- means for detecting a phase difference between interference light diffracted said diffraction grating of said object and interference light diffracted by said reference diffraction grating.

11. An alignment device according to claim 10, wherein said detection means includes a first photoelectric detector for receiving interference light diffracted by said diffraction grating of said object to produce an output, a second photoelectric detector for receiving interference light diffracted by said reference diffraction grating to produce an output, and means for comparing the phases of outputs of said first and second photoelectric detectors.

12. An alignment device according to claim 10, wherein said orientation means separates the luminous flux from said light source into first and second luminous fluxes each having plural components passing through mutually different optical paths, said first objective lens superimposes said plural components of said first separated luminous flux on said diffraction grating of said object and said second objective lens superimposes said plural components of said second separated luminous flux on said reference diffraction grating.

13. An alignment device according to claim 10, further including means for controlling a portion of said object in response to said detecting means.

14. An alignment device for alignment of first and second objects, comprising:
- a first diffraction grating and a light transmission section provided mutually near on said first object;
- a second diffraction grating provided on said second object;
- light source means for supplying luminous flux having determined orientation;
- said light source means irradiating plural sections of said luminous flux on said first diffraction grating from mutually different directions and irradiating other plural sections of said luminous flux on said second diffraction grating from mutually different directions;
- means for receiving interference light diffracted by said first diffraction grating and directed in a special direction and interference light diffracted by said second diffraction grating directed in a special direction and passed through said light transmission section of said first object to determine relative positional relation between said first and second objects.

15. An alignment device according to claim 14, wherein said receiving means includes a first photoelectric detector for receiving said interference light diffracted by said first diffraction grating to produce an output, a second photoelectric detector for receiving said interference light diffracted by said second diffraction grating to produce an output, and means for comparing phases in outputs between said first and second detectors.

16. An alignment device according to claim 14, further including an imaging optical system provided between said first and second objects and making said first and second objects substantially conjugate, and wherein said light transmission section is provided at a focusing position of said second diffraction grating formed on said first object through said imaging optical system.

* * * * *